(12) United States Patent
Shank et al.

(10) Patent No.: US 9,806,221 B2
(45) Date of Patent: Oct. 31, 2017

(54) GERMANIUM PHOTODETECTOR WITH SOI DOPING SOURCE

(71) Applicant: GLOBALFOUNDRIES INC., Grand Cayman (KY)

(72) Inventors: Steven M. Shank, Jericho, VT (US); John J. Ellis-Monaghan, Grand Isle, VT (US); Marwan H. Khater, Astoria, NY (US); Jason S. Orcutt, Katonah, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 15/441,345

(22) Filed: Feb. 24, 2017

(65) Prior Publication Data

US 2017/0162743 A1   Jun. 8, 2017

Related U.S. Application Data

(62) Division of application No. 14/830,870, filed on Aug. 20, 2015, now Pat. No. 9,647,165.

(51) Int. Cl.
| H01L 31/105 | (2006.01) |
| H01L 31/0232 | (2014.01) |
| H01L 31/18 | (2006.01) |
| H01L 31/0392 | (2006.01) |
| H01L 31/0312 | (2006.01) |

(Continued)

(52) U.S. Cl.
CPC ...... *H01L 31/1812* (2013.01); *H01L 31/0312* (2013.01); *H01L 31/03529* (2013.01); *H01L 31/03921* (2013.01); *H01L 31/1037* (2013.01); *H01L 31/1864* (2013.01)

(58) Field of Classification Search
CPC .............. H01L 31/105; H01L 31/1808; H01L 21/02532; H01L 31/022408; H01L 31/02327; H01L 31/03529; H01L 21/0245
See application file for complete search history.

(56) References Cited

U.S. PATENT DOCUMENTS 7,397,101 B1   7/2008   Masini et al.
7,510,904 B2   3/2009   Chu et al.
(Continued)

FOREIGN PATENT DOCUMENTS

CN   103646909 A   3/2014

OTHER PUBLICATIONS

Going et al., "Germanium Gate PhotoMOSFET Integrated to Silicon Photonics," IEEE Journal of Selected Topics in Quantum Electronics. 20(4), Article#: 8201607 (2014). DOI: 10.1109/JSTQE.2013.2294470.

(Continued)

*Primary Examiner* — Bradley K Smith
*Assistant Examiner* — David Goodwin
(74) *Attorney, Agent, or Firm* — Michael LeStrange; Hoffman Warnick LLC

(57) ABSTRACT

Various particular embodiments include a method for forming a photodetector, including: forming a structure including a barrier layer disposed between a layer of doped silicon (Si) and a layer of germanium (Ge), the barrier layer including a crystallization window; and annealing the structure to convert, via the crystallization window, the Ge to a first composition of silicon germanium (SiGe) and the doped Si to a second composition of SiGe.

10 Claims, 8 Drawing Sheets

(51) Int. Cl.
*H01L 31/0352* (2006.01)
*H01L 31/103* (2006.01)

(56) References Cited

U.S. PATENT DOCUMENTS

| | | |
|---|---|---|
| 7,521,737 B2 | 4/2009 | Augusto |
| 7,800,147 B2 | 9/2010 | Adkisson et al. |
| 7,989,243 B2 | 8/2011 | Liao et al. |
| 8,802,484 B1 | 8/2014 | Verma et al. |
| 8,846,440 B2 | 9/2014 | Assefa et al. |
| 2008/0073744 A1* | 3/2008 | Masini ............... H01L 31/109 257/466 |
| 2009/0108384 A1* | 4/2009 | Assefa ............... G02B 6/12004 257/432 |
| 2011/0012221 A1* | 1/2011 | Fujikata ............. G02B 6/12004 257/458 |
| 2013/0001723 A1* | 1/2013 | Meade ............... H01L 31/105 257/432 |
| 2015/0037048 A1 | 2/2015 | Na et al. |
| 2015/0364619 A1* | 12/2015 | Assefa ............... H01L 31/02327 438/69 |

OTHER PUBLICATIONS

Vivien et al., "42 GHz p.i.n. Germanium photodetector integrated in a silicon-on-insulator waveguide," Optics Express. 17(8):6252-7 (2009). http://dx.doi.org/10.1364/OE.17.006252.

Examination Report with Search Report from the Taiwan Intellectual Property Office dated May 8, 2017 for Application No. 105118906; pp. 3.

\* cited by examiner

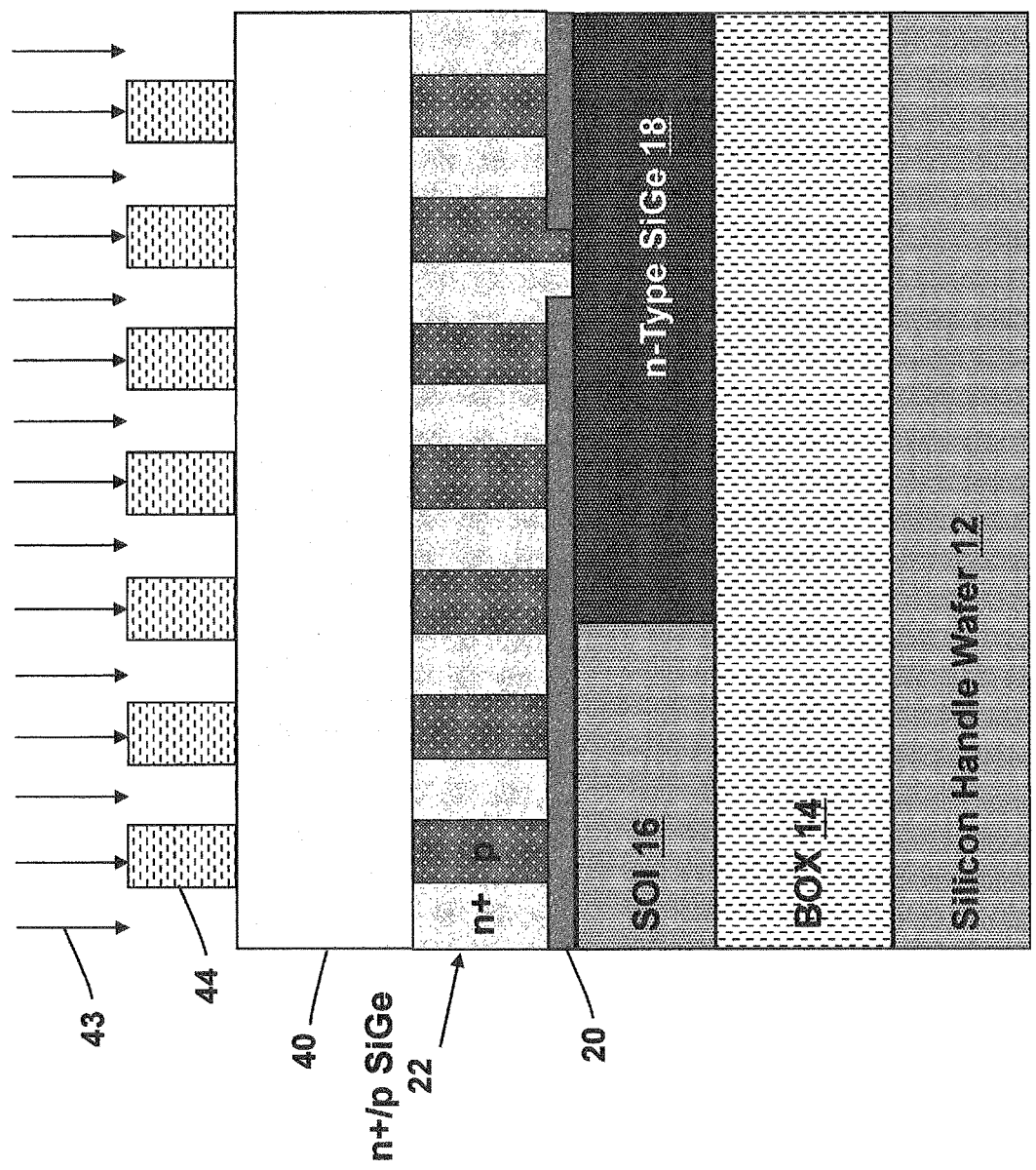

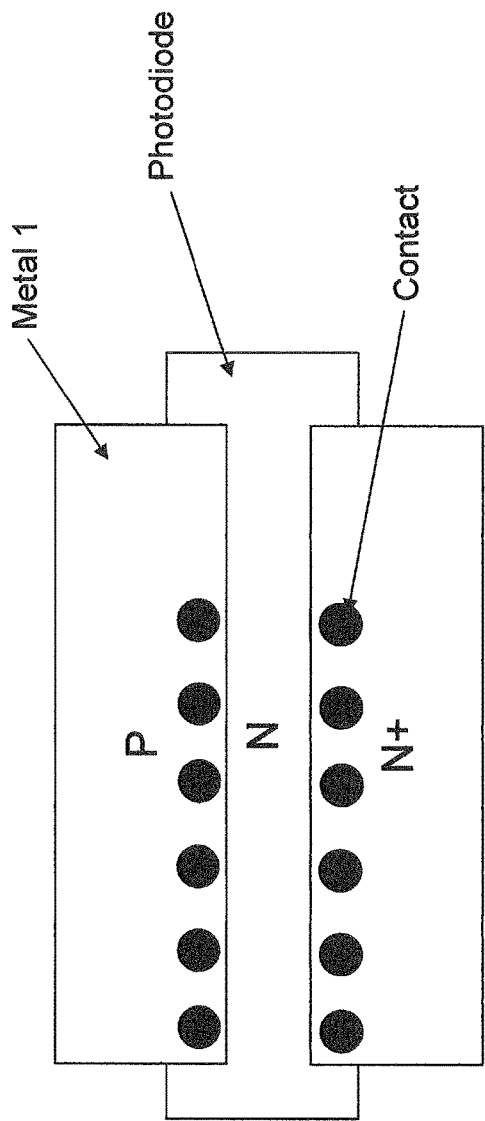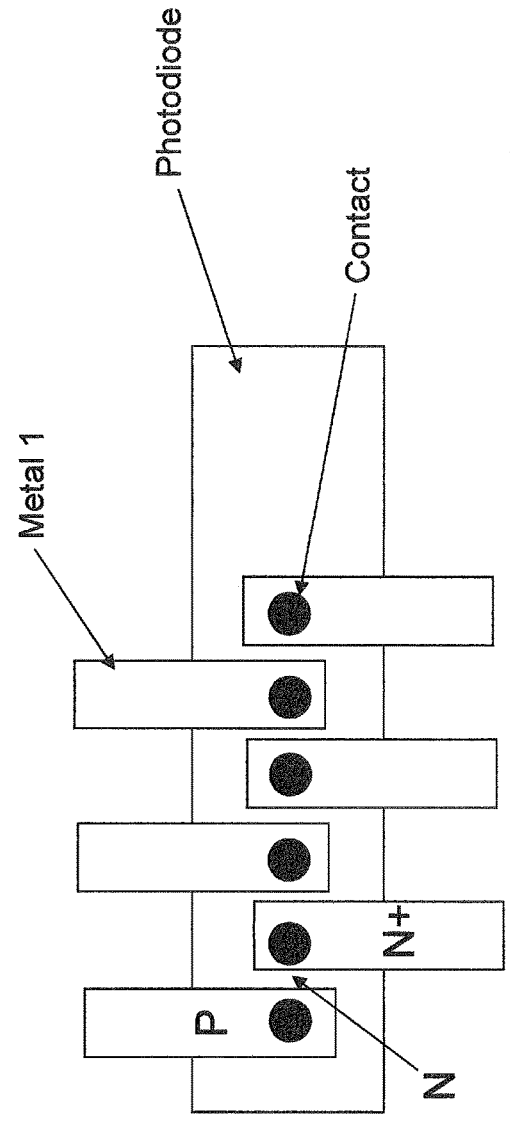
FIG. 8A
FIG. 8B

GERMANIUM PHOTODETECTOR WITH SOI DOPING SOURCE

TECHNICAL FIELD

The subject matter disclosed herein relates to integrated circuits. More particularly, the subject matter relates to a germanium (Ge) photodetector with a silicon-on-insulator (SOI) doping source.

BACKGROUND

Germanium (Ge) photodetectors are often used in a silicon photonics platform for receiving light from optical fibers or other on-chip light sources and converting the light to an electrical current. To receive optical signals with high signal to noise ratio, the dark current of a Ge photodetector is required to be low (typically ~1 µA). To this extent, reduction of dark current in Ge photodetectors is desirable.

SUMMARY

A first aspect is directed to a method for forming a photodetector, including: forming a structure including a barrier layer disposed between a layer of doped silicon (Si) and a layer of germanium (Ge), the barrier layer including a crystallization window; and annealing the structure to convert, via the crystallization window, the Ge to a first composition of silicon germanium (SiGe) and the doped Si to a second composition of SiGe.

A second aspect is directed to a semiconductor structure, comprising: a barrier layer separating a first layer of silicon germanium (SiGe) and a second layer of SiGe; and a crystallization window in the barrier layer, wherein the first layer of SiGe contacts the second layer of SiGe in the crystallization window of the barrier layer.

A third aspect is directed to a photodetector, including: a semiconductor layer including a silicon (Si) portion and an n-type silicon germanium (SiGe) portion; a SiGe layer including an alternating sequence of n+-type SiGe and p-type SiGe; a barrier layer separating the semiconductor layer from the SiGe layer; a crystallization window in the barrier layer, wherein the SiGe layer contacts the n-type SiGe portion of the semiconductor layer in the crystallization window of the barrier layer; and a plurality of metal contacts to the SiGe layer.

BRIEF DESCRIPTION OF THE DRAWINGS

These and other features of this invention will be more readily understood from the following detailed description of the various aspects of the invention taken in conjunction with the accompanying drawings that depict various embodiments of the invention.

FIGS. 3-7 depict a process for forming a Ge photodetector, according to embodiments.

FIGS. 8A and 8B depict contact arrangements for use with a Ge photodetector, according to embodiments.

DETAILED DESCRIPTION

As noted, the subject matter disclosed herein relates to integrated circuits. More particularly, the subject matter relates to a germanium (Ge) photodetector with a silicon-on-insulator (SOI) doping source.

Figure 1:
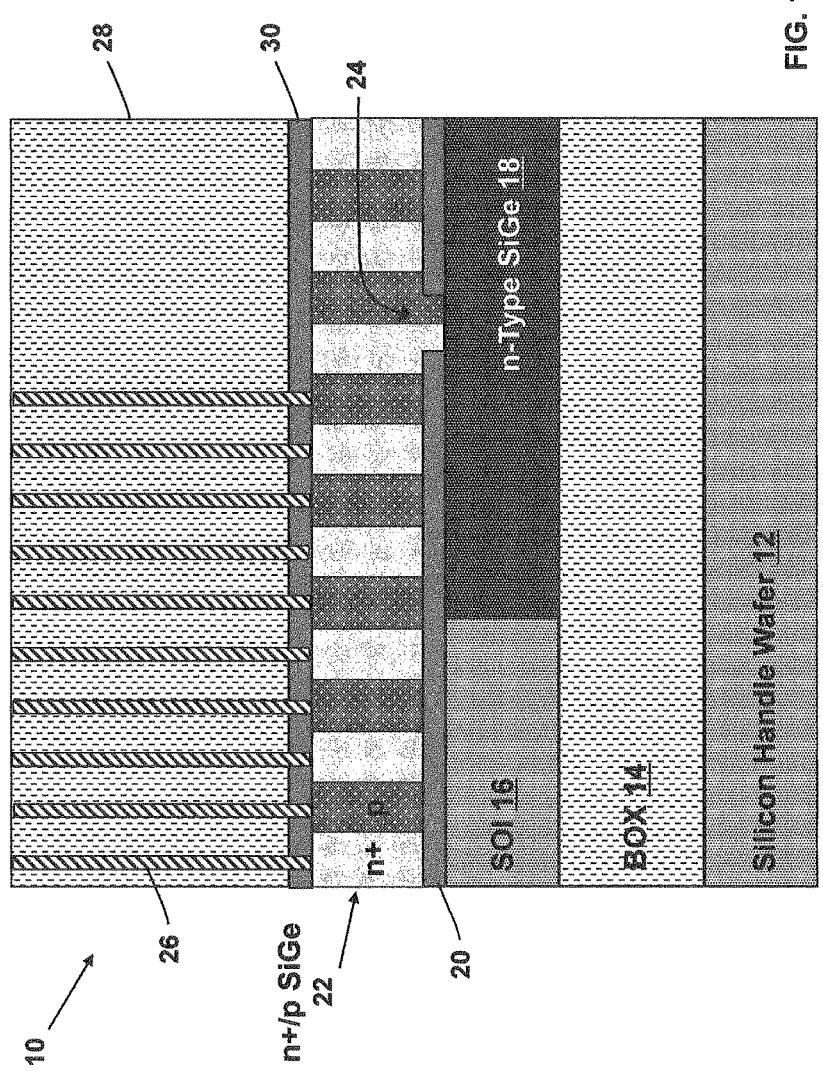
FIG. 1 depicts a germanium (Ge) photodetector structure, according to embodiments.

FIG. 1 depicts a germanium (Ge) photodetector structure 10, according to embodiments. The Ge photodetector structure 10 is formed on a substrate (e.g. a substrate of an integrated circuit). The substrate includes a silicon (Si) handle wafer 12, a buried oxide (BOX) layer 14, and a silicon-on-insulator (SOI) layer 16. A portion of the SOI layer 16 has been converted to n-type silicon germanium (SiGe) 18. In embodiments, the n-type SiGe 18 has a small percentage of Ge. For example, the n-type SiGe may comprise about 50% Si and about 50% Ge, with a range of 1% to 70% Ge.

A silicon nitride ($Si_3N_4$) barrier layer 20 is disposed between the SOI layer 16/n-type SiGe 18 and a photodiode layer 22 of alternating n+/p doped SiGe. Typical n-type SiGe 18 and n+/p photodiode layer 22 dopant concentrations of about $1e^{13}$ to about $1e^{16}$ at/$cm^2$ and typical dopants of boron, arsenic, and phosphorous may be used. In embodiments, the layer 22 of n+/p doped SiGe has a small percentage of Si. For example, the layer 22 of n+/p doped SiGe may comprise about 99% Ge and about 1% Si, with a range of about 50% Ge to about 99% Ge. A crystallization window 24, which will be described in greater detail below, is formed in the $Si_3N_4$ layer 20, where typical width dimensions of the window range from about 0.2 µm to about 1.0 µm, where larger windows can result in a larger range of germanium concentrations in n+/p SiGe 22. A plurality of metal contacts 26 are formed through a dielectric layer 28 and a $Si_3N_4$ layer 30 to the layer 22 of n+/p doped SiGe.

Figure 2A:
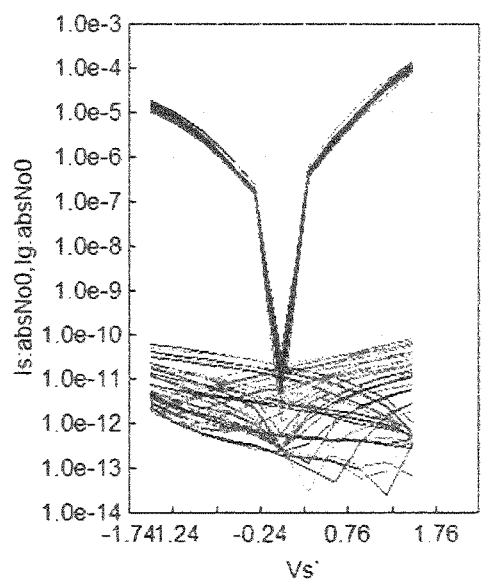
FIGS. 2A and 2B depict examples of dark current measurements for a known Ge photodetector (FIG. 2A) and a Ge photodetector structure disclosed herein (FIG. 2B).
Figure 2B:
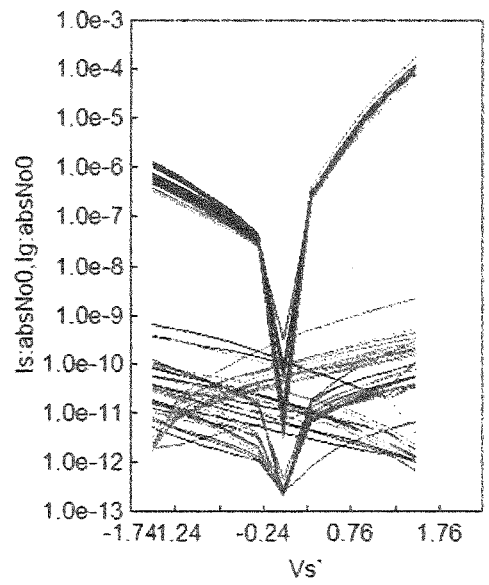

FIGS. 2A and 2B depict examples of dark current measurements for a known Ge photodetector (FIG. 2A) and a Ge photodetector structure 10 according to embodiments (FIG. 2B). Comparing FIG. 2B with FIG. 2A, the Ge photodetector structure 10 may provide, for example, a factor of 10 reduction of dark current.

An illustrative process for forming the Ge photodetector 10 is depicted in FIGS. 3-7. The following description assumes that the reader is skilled in the art of semiconductor processing. To this extent, a detailed description of the semiconductor processing techniques used in the formation of the Ge photodetector 10 will not be provided herein.

Figure 3:
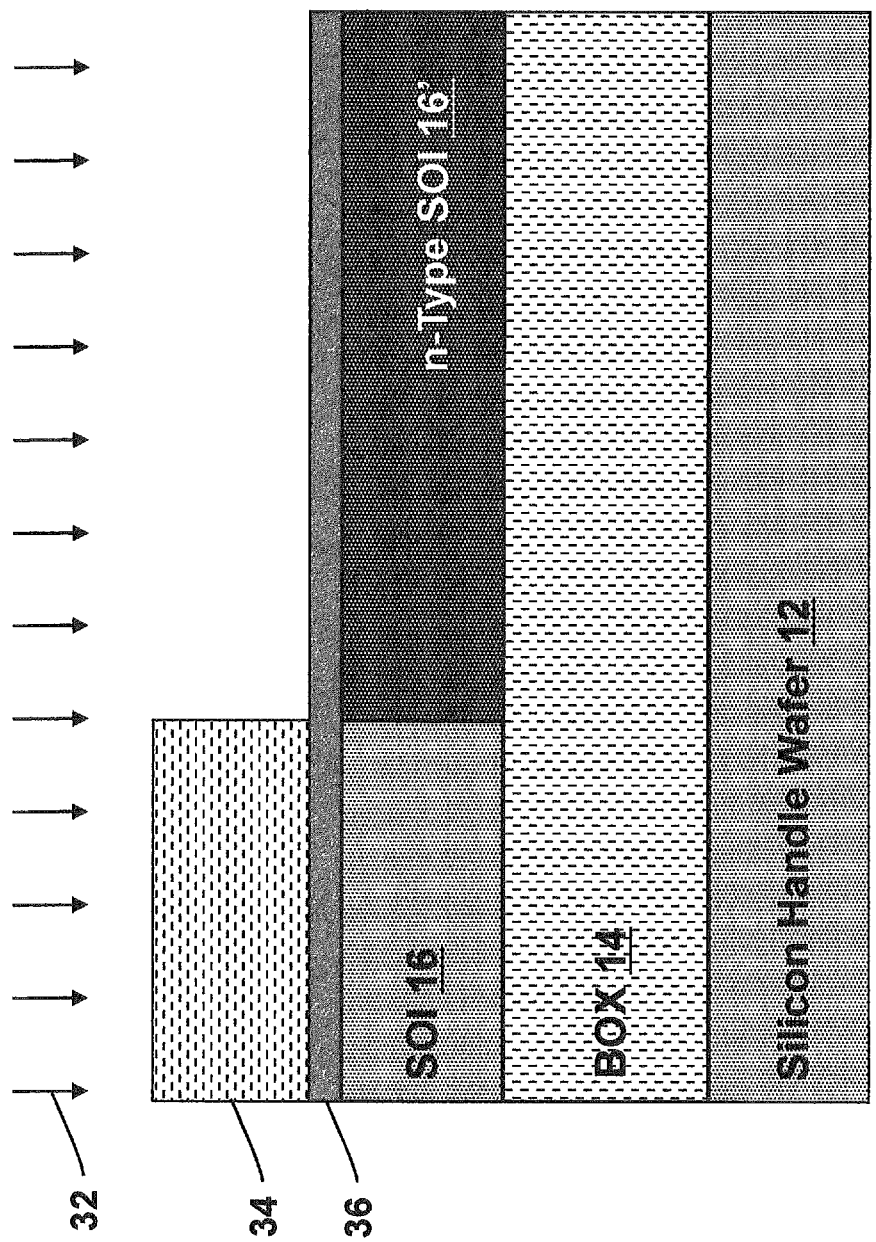
Figure 4:
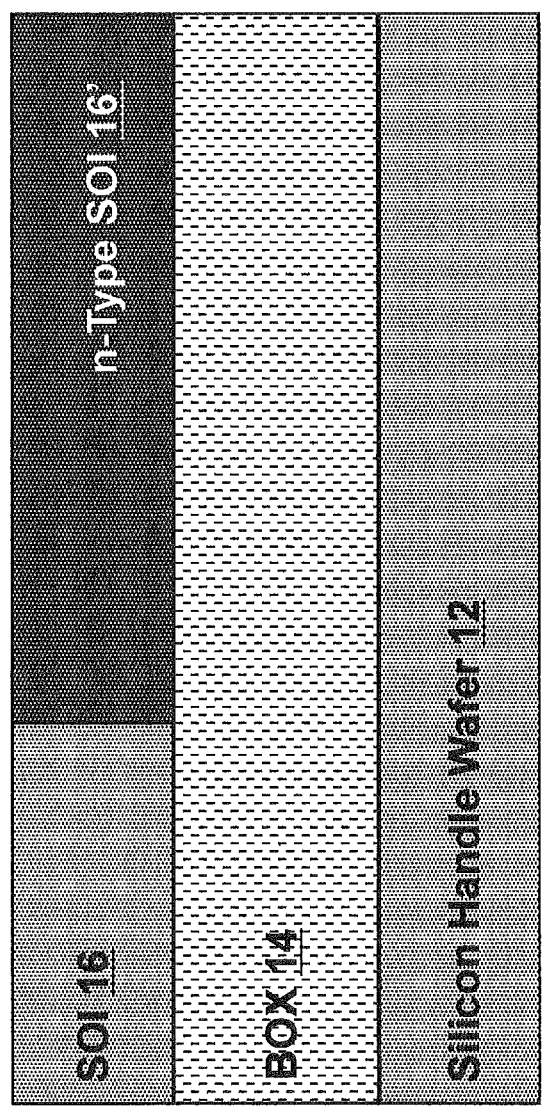

As shown in FIG. 3, a portion 16' of the SOI layer 16 is selectively implanted with an n-type dopant 32. Typical n-type dopant concentrations of about $1e^{13}$ to about $1e^{16}$ at/$cm^2$ and typical dopants of arsenic and phosphorous may be used. A mask 34 and an oxide layer 36 used during the doping process are subsequently removed to provide the structure shown in FIG. 4.

Figure 5:
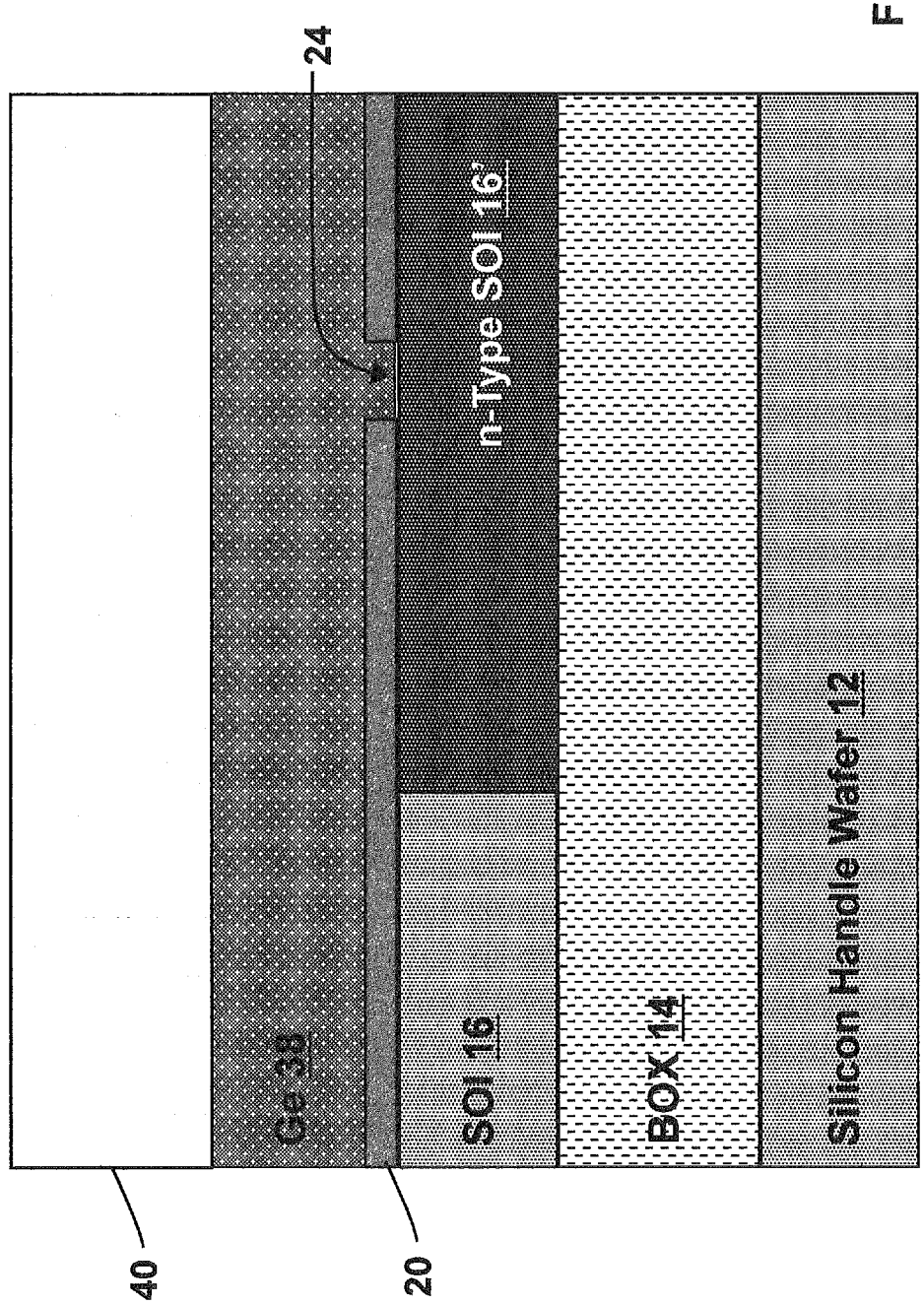

A $Si_3N_4$ layer barrier 20 is deposited over the SOI layer 16/16' as depicted in FIG. 5. A portion of the $Si_3N_4$ layer 20 located above the n-type doped portion 16' of the SOI layer 16 is selectively etched to form a crystallization window 24. A layer 38 of intrinsic Ge is then deposited over the $Si_3N_4$ layer 20. The Ge layer 38 fills the crystallization window 24, contacting the surface of the n-type doped portion 16' of the SOI layer 16 through the crystallization window 24. A protective encapsulation layer 40, comprising, for example, one or more layers of $Si_3N_4$ and silicon dioxide ($SiO_2$), is deposited over the Ge layer 38.

Figure 6:
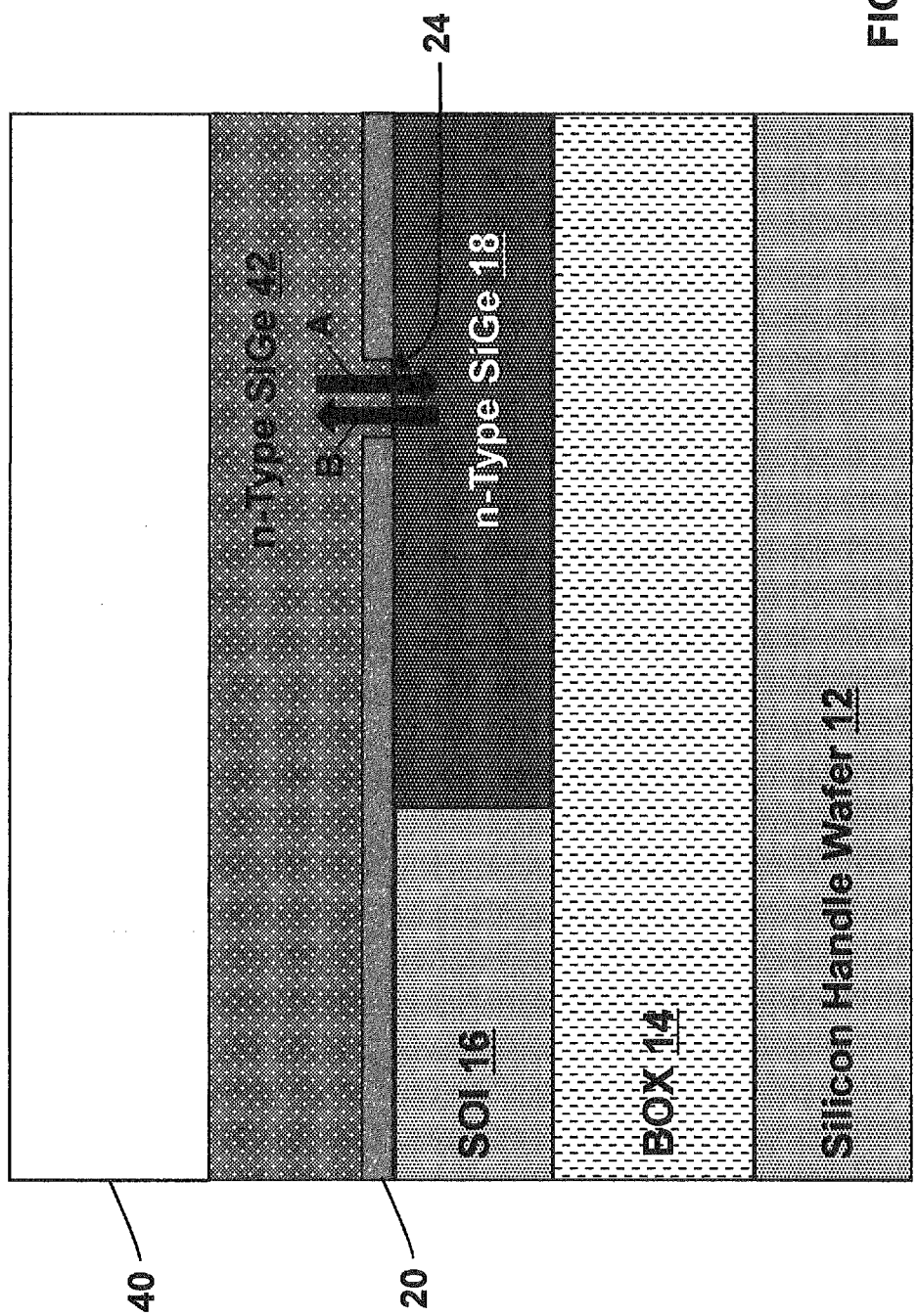

A rapid thermal anneal (RTA) is then performed, where typical temperatures of between about 900° C. and about 1100° C. may be used. During the RTA, as depicted in FIG. 6, the intrinsic Ge layer 38 (FIG. 5) melts and some of the Ge diffuses through the crystallization window 24 into the n-type doped portion 16' of the SOI layer 16 (arrow A) to form an n-type SiGe 18. The n-type SiGe 18 thus formed (which has a lower melting temperature than Si) also melts during the RTA. In embodiments, the n-type SiGe 18 may comprise about 50% Si and about 50% Ge.

During the RTA, the Si and the n-type dopant of the n-type doped portion 16' of the SOI layer 16 also diffuse through the crystallization window 24 (arrow B) intermixing with the melted Ge layer 38 to form an n-type SiGe layer 42. In embodiments, the n-type SiGe layer 42 has a graded percentage of Si. For example the n-type SiGe layer 42 may start with a higher level of Si (about 1% to about 50%) and grades to a very small percentage of Si (<1%) over several microns of length.

After completion of the RTA, both the n-type SiGe 18 and the n-type SiGe layer 42 cool and recrystallize. As depicted in FIG. 7, the n-type SiGe layer 42 may then be implanted with n-type and p-type dopants 43 using one or more mask structures 44 to form a photodetector layer 22 of n+/p doped SiGe. Metal contacts 26, as shown in FIG. 1, may then be formed to the layer 22 of n+/p doped SiGe. As depicted in FIGS. 8A and 8B, the metal contacts 26 may be provided, for example, using a lateral contact geometry (FIG. 8A) or interdigitated contact geometry (FIG. 8B) to provide n+/n/p or n+/p junction designs. In both geometries, there is the option of using or not using an intrinsic region.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for forming a photodetector, comprising:
    forming a structure including a barrier layer disposed between a layer of doped silicon (Si) and a layer of germanium (Ge), the barrier layer including a crystallization window;
    annealing the structure to convert, via the crystallization window, the layer of Ge to a first composition of graded silicon germanium (SiGe) and the doped Si to a second composition of graded SiGe; and
    doping the first composition of graded SiGe with a p-type dopant forming p-type regions and heavily doping with an n-type dopant forming n-type regions in an alternating sequence.

2. The method of claim 1, wherein the annealing causes a melting of the Ge layer.

3. The method of claim 2, wherein Ge diffuses from the melted Ge layer through the crystallization window into the doped Si layer to form the second composition of graded SiGe.

4. The method of claim 3, wherein the second composition of graded SiGe comprises about 50% Si and about 50% Ge.

5. The method of claim 2, wherein Si and dopant diffuse from the doped Si layer through the crystallization window into the melted Ge layer to form the first composition of graded SiGe.

6. The method of claim 5, wherein the first composition of graded SiGe comprises about 99% Ge and about 1% Si.

7. The method of claim 1, wherein the doped Si layer includes an n-type dopant.

8. The method of claim 1, further comprising cooling the structure to crystalize the first composition of graded SiGe and the second composition of graded SiGe.

9. The method of claim 1, further comprising forming a plurality of contacts to the first composition of graded SiGe.

10. The method of claim 1, wherein the crystallization window has a width from about 0.2 μm to about 1.0 μm.

* * * * *